United States Patent
Yoon et al.

(10) Patent No.: US 10,051,767 B2
(45) Date of Patent: *Aug. 14, 2018

(54) METHOD AND APPARATUS FOR COVERING A FASTENER SYSTEM

(71) Applicant: The Boeing Company, Chicago, IL (US)

(72) Inventors: Ilsop Steven Yoon, Renton, WA (US); Kevin Darrell Pate, Kirkland, WA (US); Carissa Ann Pajel, Redmond, WA (US); Todd Michael Alberts, Seattle, WA (US); Darrin Michael Hansen, Seattle, WA (US)

(73) Assignee: The Boeing Company, Chicago, IL (US)

( * ) Notice: Subject to any disclaimer, the term of this patent is extended or adjusted under 35 U.S.C. 154(b) by 396 days.

This patent is subject to a terminal disclaimer.

(21) Appl. No.: 14/725,994

(22) Filed: May 29, 2015

(65) Prior Publication Data

US 2015/0271960 A1    Sep. 24, 2015

Related U.S. Application Data

(63) Continuation-in-part of application No. 13/630,741, filed on Sep. 28, 2012, now Pat. No. 9,140,291.

(51) Int. Cl.
*F16B 21/00* (2006.01)
*H05K 9/00* (2006.01)
(Continued)

(52) U.S. Cl.
CPC ....... *H05K 9/0067* (2013.01); *B32B 37/0076* (2013.01); *B32B 37/12* (2013.01);
(Continued)

(58) Field of Classification Search
CPC .. H05K 9/0067; B32B 37/0076; B32B 37/12; F16B 37/14
(Continued)

(56) References Cited

U.S. PATENT DOCUMENTS

| 2,710,113 A | 6/1955 | Pritchard |
| 4,382,049 A * | 5/1983 | Hofmeister ............. B29C 70/74 174/2 |

(Continued)

FOREIGN PATENT DOCUMENTS

| CN | 102678927 A | 9/2012 |
| EP | 0334011 A1 | 9/1989 |

(Continued)

OTHER PUBLICATIONS

PCT Search Report dated Nov. 4, 2013, regarding Application No. PCT/US2013053601, 11 pages.
(Continued)

*Primary Examiner* — Gary W Estremsky
(74) *Attorney, Agent, or Firm* — Yee & Associates, P.C.

(57) ABSTRACT

A method and apparatus for covering a fastener system. In one illustrative embodiment, an apparatus comprises a cover. The cover is configured to be placed over a fastener system at a surface of an object in which the fastener system is installed. The cover is comprised of a number of composite materials selected such that the cover is configured to reduce an effect of an electrical discharge, which occurs around the fastener system, on an environment outside the cover.

18 Claims, 8 Drawing Sheets

(51) Int. Cl.
*B32B 37/18* (2006.01)
*B32B 37/15* (2006.01)
*B32B 37/12* (2006.01)
*B32B 37/00* (2006.01)
*B64D 45/02* (2006.01)
*F16B 37/14* (2006.01)
*F16B 11/00* (2006.01)
*F16B 33/00* (2006.01)

(52) U.S. Cl.
CPC ............ *B32B 37/153* (2013.01); *B32B 37/18* (2013.01); *B64D 45/02* (2013.01); *F16B 37/14* (2013.01); *H05K 9/0079* (2013.01); *B32B 2435/00* (2013.01); *F16B 11/006* (2013.01); *F16B 33/004* (2013.01)

(58) Field of Classification Search
USPC ........... 361/218; 411/337, 372.5, 372.6, 373, 411/377
See application file for complete search history.

(56) References Cited

U.S. PATENT DOCUMENTS

| | | | | |
|---|---|---|---|---|
| 4,519,974 | A * | 5/1985 | Bravenec | ................ B29C 39/10 249/117 |
| 4,826,380 | A * | 5/1989 | Henry | .................... B64D 45/02 156/229 |
| 4,905,931 | A | 3/1990 | Covey | |
| 7,277,266 | B1 | 10/2007 | Le et al. | |
| 7,438,974 | B2 * | 10/2008 | Obuhowich | ......... C09K 3/1012 277/316 |
| 7,721,996 | B2 | 5/2010 | Gehrett et al. | |
| 7,740,434 | B2 | 6/2010 | Kamino et al. | |
| 7,835,130 | B2 | 11/2010 | Ware et al. | |
| 7,969,706 | B2 | 6/2011 | Heeter et al. | |
| 8,388,293 | B2 | 3/2013 | Hutter, III | |
| 8,634,177 | B2 * | 1/2014 | Kawahara | ................ B64C 3/34 361/117 |
| 8,711,541 | B2 * | 4/2014 | Umemoto | ............. B64D 45/02 361/218 |
| 2011/0315818 | A1 | 12/2011 | Chao et al. | |
| 2012/0074257 | A1 | 3/2012 | Bessho et al. | |
| 2012/0138609 | A1 | 6/2012 | Gerken et al. | |
| 2012/0219380 | A1 * | 8/2012 | Hutter, III | ............... F16B 37/14 411/377 |
| 2014/0091175 | A1 | 4/2014 | Yoon et al. | |

FOREIGN PATENT DOCUMENTS

| | | |
|---|---|---|
| EP | 2465777 A2 | 6/2012 |
| JP | 2011103517 A | 5/2011 |
| JP | 2011173439 A | 9/2011 |
| WO | WO2013178985 A1 | 12/2013 |

OTHER PUBLICATIONS

Final Office Action, dated Feb. 6, 2015, regarding U.S. Appl. No. 13/630,741, 12 pages.
Office Action, dated Sep. 23, 2014, regarding U.S. Appl. No. 13/630,741, 20 pages.
Notice of Allowance, dated May 18, 2015, regarding U.S. Appl. No. 13/630,741, 10 pages.
Japanese Patent Office Notification of Reasons for Rejection, dated Jun. 13, 2017, regarding Application No. 2015-534489, 10 pages.
Japanese Patent Office Notification of Reasons for Rejection and English Translation, dated Nov. 29, 2016, regarding Application No. 2015-534489, 10 pages.
Canadian Intellectual Property Office Examination Search Report, dated Dec. 28, 2016, regarding Application No. 2,880,073, 4 pages.
Japanese Patent Office Notification for Reasons for Rejection, dated Dec. 7, 2017, regarding Application No. 2015-534489, 13 pages.

* cited by examiner

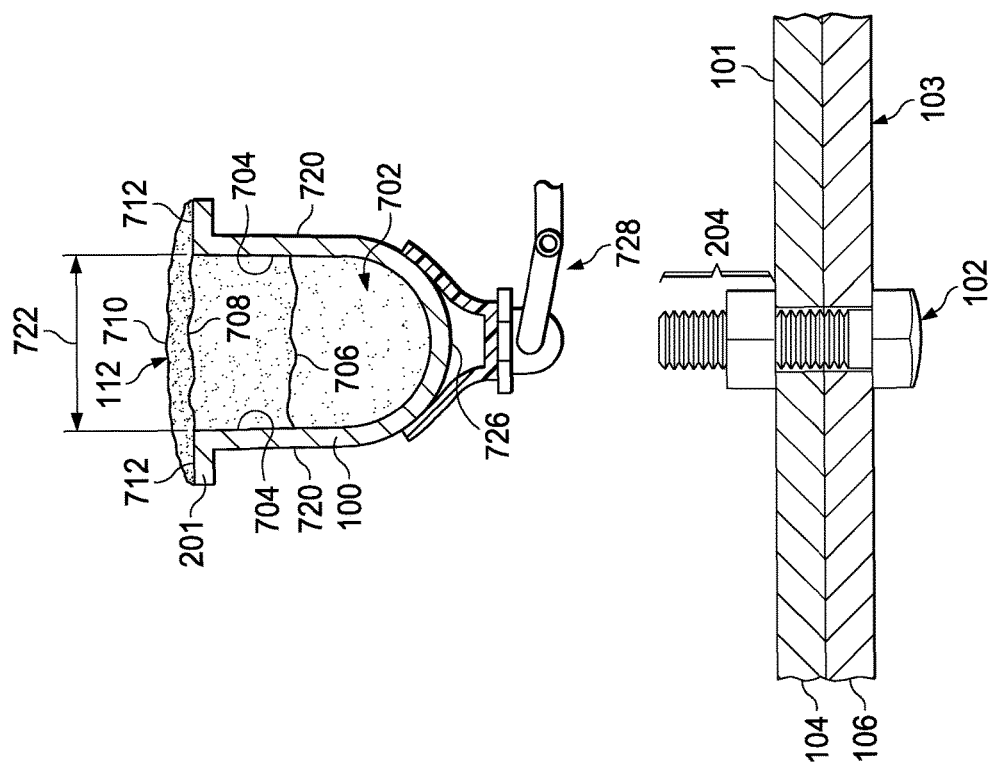

METHOD AND APPARATUS FOR COVERING A FASTENER SYSTEM

This application is a continuation-in-part of U.S. patent application Ser. No. 13/630,741, filed on Sep. 28, 2012, which issued as U.S. Pat. No. 9,140,291 on Sep. 22, 2015 and which is incorporated herein by reference in its entirety.

BACKGROUND INFORMATION

1. Field

The present disclosure relates generally to covers and, in particular, to covers comprised of composite materials. Still more particularly, the present disclosure relates to a method and apparatus for covering the ends of fastener systems using covers comprised of composite materials selected such that the covers have electrical properties within selected ranges.

2. Background

Sealant materials are oftentimes used to cover and seal fastener systems. In some cases, a sealant material is pre-molded into a cap having a shape configured to be installed over the end of a fastener system to cover the fastener system and seal the fastener system. In particular, this "cap" is used to prevent substances such as, for example, without limitation, air, liquid, dirt, and/or other types of substances from crossing the barrier formed by the cap.

Sealant materials may be used to cover and seal fastener systems in different types of systems and structures. In some cases, at least one component in a fastener system is comprised of an electrically conductive material, such as, for example, metal.

The sealant material used to cover the fastener system may be configured to help suppress the potential for electrical discharge. However, some currently available sealant materials are comprised of elastomeric materials. Elastomeric materials are also referred to as elastomers. These types of sealant materials may be referred to as elastomeric sealants. Elastomeric sealants may be sensitive to temperature. As the temperature of the elastomeric sealant changes, the performance of the elastomeric sealant with respect to suppressing the potential for electrical discharge may be less than desired.

Further, pre-molding an elastomeric sealant into the shape of a cap may be more difficult and/or time-consuming than desired. The elastomeric sealant may not be as strong as desired. Consequently, the elastomeric sealant may need to have a thickness that is greater than desired to perform at the desired level. Therefore, it would be desirable to have a method and apparatus that takes into account at least some of the issues discussed above, as well as other possible issues.

SUMMARY

In one illustrative embodiment, an apparatus comprises a cover. The cover is configured to be placed over a fastener system at a surface of an object in which the fastener system is installed. The cover is comprised of a number of composite materials selected such that the cover is configured to reduce an effect of an electrical discharge, which occurs around the fastener system, on an environment outside the cover.

In another illustrative embodiment, a method for covering a fastener system is provided. A cover is placed over a fastener system at a surface of an object in which the fastener system is installed. The cover is comprised of a number of composite materials. An effect of an electrical discharge, occurring around the fastener system, on an environment outside the cover is reduced using the cover.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIGS. 7A and 7B are illustrations of cross-sectional views of a cover installed over a fastener system in accordance with an illustrative embodiment; FIG. 7A is an illustration of a cross-sectional view of a cover connected to a machine in accordance with an illustrative embodiment; FIG. 7B is an illustration of a cross-sectional view of a cover being installed over a fastener system by the machine, in accordance with an illustrative embodiment.

DETAILED DESCRIPTION

The different illustrative embodiments recognize and take into account different considerations. For example, the illustrative embodiments recognize and take into account that it may be easier and less time-consuming to form a cap for a fastener system that is comprised of a composite material as compared to an elastomeric material.

Further, the illustrative embodiments recognize and take into account that a composite material may be designed and formed to have electrical properties with values within selected ranges. In particular, these ranges may be selected such that the composite material is capable of suppressing the potential for electrical discharge.

However, a cap formed from a composite material may be unable by itself to provide the quality of seal that can be provided by an elastomeric sealant. Consequently, the illustrative embodiments recognize and take into account that it may be desirable to use both an elastomeric sealant and a cap formed from a composite material to cover the end of a fastener system.

Figure 1:
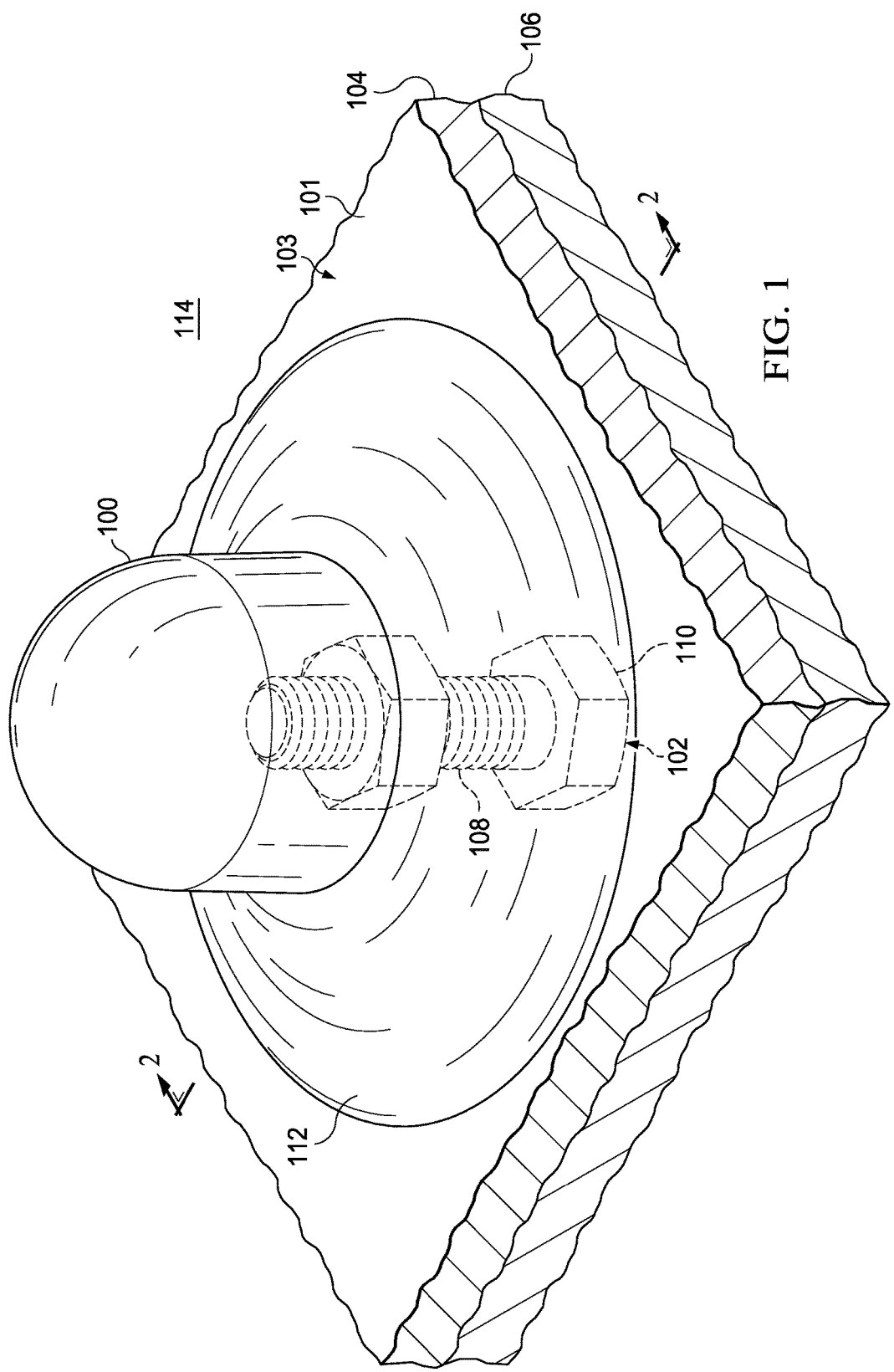
FIG. 1 is an illustration of an isometric view of a cover installed over a fastener system in accordance with an illustrative embodiment.

With reference now to FIG. 1, an illustration of an isometric view of a cover installed over a fastener system is depicted in accordance with an illustrative embodiment. As depicted, cover 100 has been installed over fastener system 102. In particular, cover 100 has been placed over fastener system 102 at surface 101 of object 103 in which fastener system 102 is installed.

As depicted, object 103 includes first structure 104 and second structure 106. Fastener system 102 is being used to join first structure 104 to second structure 106. Depending on the implementation, a fastener system, such as fastener system 102, may be used to join different types of structures. Each of the structures joined by the fastener system may take the form of, for example, without limitation, a skin panel, a rod, a beam, a spar, a rib, a tube, a plate, a structural assembly or some other type of structure.

In this illustrative example, fastener system 102 is comprised of number of components 108. As used herein, a "number of" items may be one or more items. In this manner, number of components 108 may be one or more components. In this example, number of components 108 includes bolt 110 as well as a nut (not shown in this view).

However, in other illustrative examples, fastener system 102 may be comprised of a number of components that include at least one of a fastener, a washer, a plate, a spacer, a gasket, a buckle, a locking device, and some other type of component. The fastener in the number of components may be selected from one of a screw, a nut, a bolt, a nail, a rod, a dowel, a pin, a clamp, a grommet, a latch, a peg, a clip, a rod, a zipper, an anchor, a tie, a tag, and other types of fasteners.

As used herein, the phrase "at least one of", when used with a list of items, means different combinations of one or more of the listed items may be used and only one of each item in the list may be needed. For example, "at least one of item A, item B, and item C" may include, without limitation, item A or item A and item B. This example also may include item A, item B, and item C or item B and item C. In other examples, "at least one of" may be, for example, without limitation, two of item A, one of item B, and ten of item C; four of item B and seven of item C; and other suitable combinations.

Sealant material 112 is used to attach cover 100 to surface 101 of object 103. In particular, sealant material 112 has adhesive properties that allow cover 100 to be fixedly installed over fastener system 102.

Sealant material 112 may be comprised of an elastomeric material in this depicted example. As a result, sealant material 112 may be referred to as an elastomeric sealant. In other illustrative examples, sealant material 112 may be comprised of a filler material in addition to the elastomeric material. In some cases, sealant material 112 may be comprised of one or more of an elastomeric material, a resin material, an acrylic material, an elastic material, a silicone material, a rubber material, and other types of materials.

In this illustrative example, sealant material 112 is applied over fastener system 102 prior to cover 100 being placed over fastener system 102. Cover 100 is then placed over sealant material 112. Of course, in other illustrative examples, sealant material 112 may be applied to an inside of cover 100 prior to cover 100 being placed over fastener system 102. In other words, cover 100 may be pre-filled with sealant material 112.

In this illustrative example, placement of cover 100 over sealant material 112 causes a portion of sealant material 112 to at least partially surround a flange (not shown in this view, shown as 201 in FIG. 2) of cover 100. In other words, when cover 100 is placed over sealant material 112, a portion of sealant material 112 squeezes out of and around the flange (not shown in this view; shown as 201 in FIG. 2) of cover 100. Of course, in other illustrative examples (not shown), sealant material 112 may extend beyond the flange (shown as 201 in FIG. 2) of cover 100.

Cover 100 may be comprised of a number of composite materials. In this illustrative example, cover 100 is comprised of a composite material in the form of a carbon fiber-reinforced plastic (CFRP) material. However, depending on the implementation, cover 100 may be comprised of a number of composite materials that include at least one of a carbon fiber-reinforced plastic material, a fiber-reinforced polymer, a glass-reinforced plastic, an aramid fiber-reinforced material, a metallic material, a fiberglass material, a plastic material, a thermoplastic material, a thermoset material, and some other type of composite material.

In this illustrative example, cover 100 is comprised of a number of composite materials selected to provide cover 100 with certain selected properties. For example, in certain situations, an electrical discharge may occur around fastener system 102. The electrical discharge may be, for example, without limitation, an electrical arc or a spark.

Figure 2:
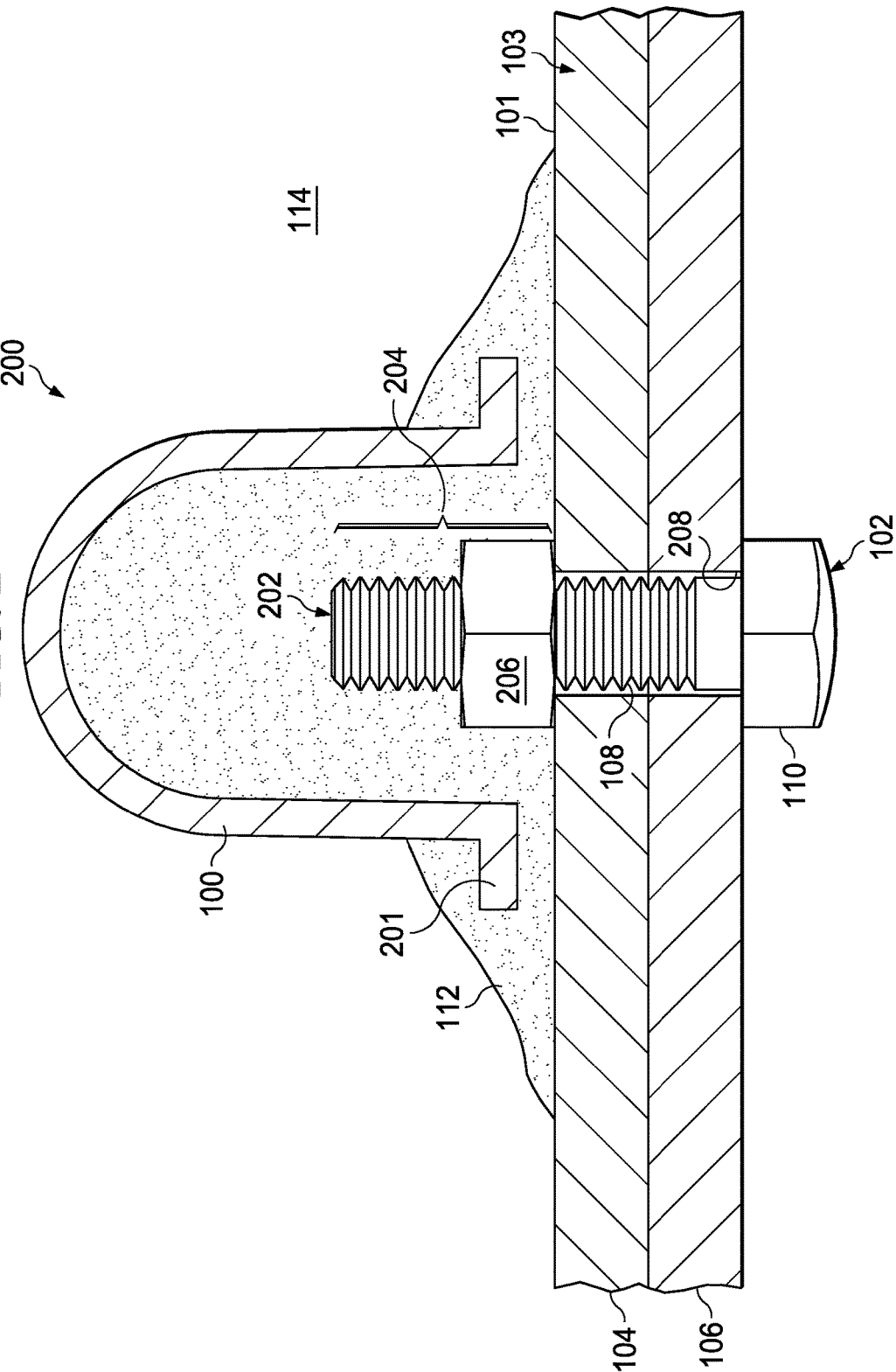
FIG. 2 is an illustration of a cross-sectional view of a cover installed over a fastener system in accordance with an illustrative embodiment.

It would be desirable to inhibit any electrical discharge that may occur from any components that may make up fastener system 102 or between fastener system 102 and materials that might form an object that fastener system 102 may be attached to, such as without limitation, object 103 as shown in FIG. 2. Cover 100 may be comprised of a number of composite materials selected such that cover 100 is configured to reduce an effect of a possible electrical discharge environment 114 outside cover 100. For example, an electrical discharge around fastener system 102 may cause a number of materials to be released inside cover 100. These materials may include, for example, without limitation, a number of gases, a number of liquids, and/or a number of particulates. Further, these materials may be hot when released.

Cover 100 is configured to reduce an undesired release of these materials into environment 114 outside cover 100. In other words, cover 100 forms a barrier that substantially prevents these materials from escaping into environment 114.

In some cases, object 103 may be a fuel tank in an aerospace vehicle and surface 101 of object 103 may be an inner surface of the fuel tank. In this manner, environment 114 may be the inside chamber of the fuel tank. A release of hot materials inside the fuel tank may cause undesired effects within the fuel tank. Cover 100 is configured to reduce and/or prevent the undesired release of materials into the fuel tank to reduce a possibility of undesired effects occurring within the fuel tank in response to the electrical discharge occurring around the fastener system.

Additionally, cover 100 may be comprised of a number of composite materials selected such that cover 100 is configured to dissipate static charge. In particular, the number of composite materials may be selected such that at least one electrical property of cover 100 has a value within a range selected such that cover 100 is capable of dissipating static charge. In other words, cover 100 may be static dissipative. The at least one electrical property of the cover may include at least one of an electrical resistance of the cover, an electrical conductivity of the cover, and an electrical resistivity of the cover.

As used herein, the "electrical resistance" of an item is the opposition of the item to the flow of electric current through the item. The "electrical conductivity" of an item is the ability of the item to allow the flow of electric current through the item. The "electrical resistivity" an item is the ability of that item to prevent an electrical current from being conducted through the item.

In one illustrative example, cover 100 may be configured such that the electrical resistivity of cover 100 comprises a volume resistivity of about $1.0 \times 10^9$ ohm-meters ($\Omega$-m) or less when measured at about 40 volts (V) or less and/or a surface resistivity of about $1.0 \times 10^{11}$ ohm per square ($\Omega$/sq) or less when measured at about 100 volts (V) or less.

In some cases, the number of composite materials from which cover 100 is formed may be selected to reduce corrosion.

With reference now to FIG. 2, an illustration of a cross-sectional view of a cover installed over a fastener system is depicted in accordance with an illustrative embodiment. In this illustrative example, a cross-sectional view of cover 100 installed over fastener system 102 in FIG. 1 is depicted taken along lines 2-2.

Cover 100 has shape 200. Shape 200 may be a bullet-type shape (as shown in FIG. 2) or conical shape (not shown) having flange 201. Flange 201 of cover 100 is surrounded and covered by sealant material 112. Sealant material 112 attaches flange 201 to surface 101 of object 103.

Shape 200 is configured such that cover 100 may receive end 202 of fastener system 102 and cover substantially all of exposed portion 204 of fastener system 102. Exposed portion 204 of fastener system 102 includes nut 206. Exposed portion 204 of fastener system 102 is the portion of fastener system 102 that extends past surface 101 of object 103.

Fastener system 102 is located in hole 208 in object 103. As depicted, cover 100 may be configured to substantially prevent fluid flowing through hole 208 from flowing into environment 114 outside cover 100. Further, cover 100 may be configured to substantially prevent fluid in environment 114 outside cover 100 from flowing through hole 208. For example, when object 103 is a fuel tank and surface 101 is an inner surface of the fuel tank, cover 100 substantially prevents fuel stored within the fuel tank from leaking outside of the fuel tank through hole 208. Similarly, cover 100 substantially prevents fluid flowing through hole 208 from entering inside the fuel tank.

The illustrations of cover 100 and fastener system 102 in FIGS. 1-2 are not meant to imply physical or architectural limitations to the manner in which an illustrative embodiment may be implemented. Other components in addition to or in place of the ones illustrated may be used. Some components may be optional.

For example, in some cases, cover 100 may have a different shape than shape 200 in FIG. 2. In other illustrative examples, cover 100 may be used to cover the ends of two fastener systems with sealant material 112 applied over the ends of both fastener systems.

In still other illustrative examples, a coating may be applied to cover 100 to provide cover 100 with the capability to dissipate static charge. In some cases, a corrosion prevention coating may be applied to at least a portion of cover 100.

In some illustrative examples, sealant material 112 may be applied to first structure 104 without coming into contact with fastener system 102. For example, sealant material 112 may be applied in the shape of a ring around fastener system 102. However, sealant material 112 may be applied in a manner such that flange 201 of cover 100 may still contact sealant material 112 when cover 100 is placed over sealant material 112 and fastener system 102. In these examples, sealant material 112 may be used solely for attaching cover 100 to fastener system 102 and sealing an interface between cover 100 and fastener system 102. In other illustrative examples, sealant material 112 may not be used to cover fastener system 102. Instead, an adhesive material and/or some other type of material may be used to install cover 100 over fastener system 102. Depending on the manner in which the adhesive material and/or other materials are applied, these materials may not come into contact with fastener system 102.

Figure 3:
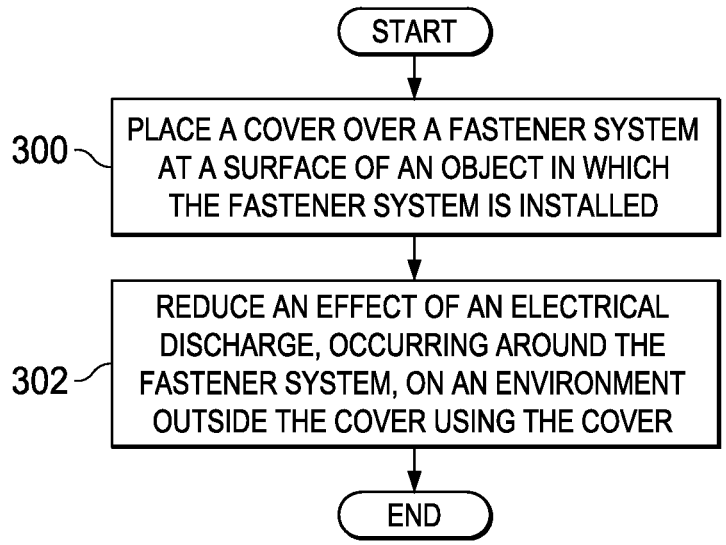
FIG. 3 is an illustration of a process for installing a cover on a fastener system in the form of a flowchart in accordance with an illustrative embodiment.

Turning now to FIG. 3, an illustration of a process for installing a cover on a fastener system in the form of a flowchart is depicted in accordance with an illustrative embodiment. The process illustrated in FIG. 3 may be used to install a cover, such as, for example, without limitation, cover 100 from FIG. 1, over a fastener system, such as, for example, without limitation, fastener system 102 from FIG. 1.

The process begins by placing a cover over a fastener system at a surface of an object in which the fastener system is installed (operation 300). The cover is comprised of a number of composite materials. In these illustrative examples, a sealant material may be either applied over the fastener system and/or applied inside the cover prior to the cover being placed over the fastener system 102 from FIG. 1. Placement of the cover over the fastener system may cause a portion of the sealant material to squeeze outside of a flange of the cover from under the flange.

Thereafter, an effect of an electrical discharge, occurring around the fastener system, on an environment outside the cover is reduced using the cover (operation 302), with the process terminating thereafter. In particular, in operation 302, the cover may reduce an undesired release of a number of materials into the environment outside the cover in response to the electrical discharge occurring around the fastener system.

Figure 4:
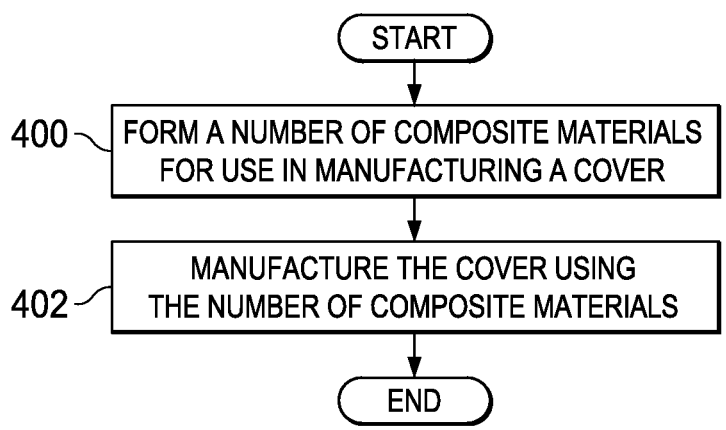
FIG. 4 is an illustration of a process for manufacturing a cover for a fastener system in the form of a flowchart in accordance with an illustrative embodiment.

With reference now to FIG. 4, an illustration of a process for manufacturing a cover for a fastener system in the form of a flowchart is depicted in accordance with an illustrative embodiment. The process illustrated in FIG. 4 may be used to manufacture a cover, such as, for example, without limitation, cover 100 from FIG. 1.

The process begins by forming a number of composite materials for use in manufacturing the cover (operation 400). In operation 400, the number of composite materials may be formed according to specifications selected such that the at least one electrical property of the cover will have a value within a selected range.

In particular, the number of composite materials may be formed according to specifications selected such that at least one of the electrical resistance of the cover, the electrical conductivity of the cover, and the electrical resistivity of the cover has a value within a selected range. The range may be selected such that the cover will be static dissipative. In this illustrative example, the number of composite materials may include a carbon fiber-reinforced plastic material.

Thereafter, the process continues by manufacturing the cover using the number of composite materials (operation 402), with the process terminating thereafter. In operation 402, the cover is manufactured such that the cover has a shape configured to receive the end of the fastener system and any components of the fastener system that extend past a surface of the object in which the fastener system is installed. As a non-limiting example, the cover is manufactured with a shape that may cover a section of the fastener that may protrude from the surface of the object.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a module, a segment, a function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Figure 5:
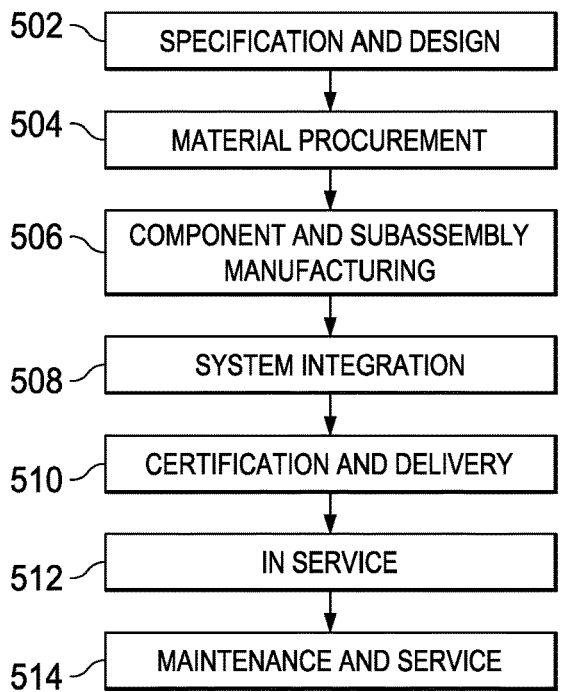
FIG. 5 is an illustration of an aircraft manufacturing and service method in the form of a block diagram in accordance with an illustrative embodiment.
Figure 6:
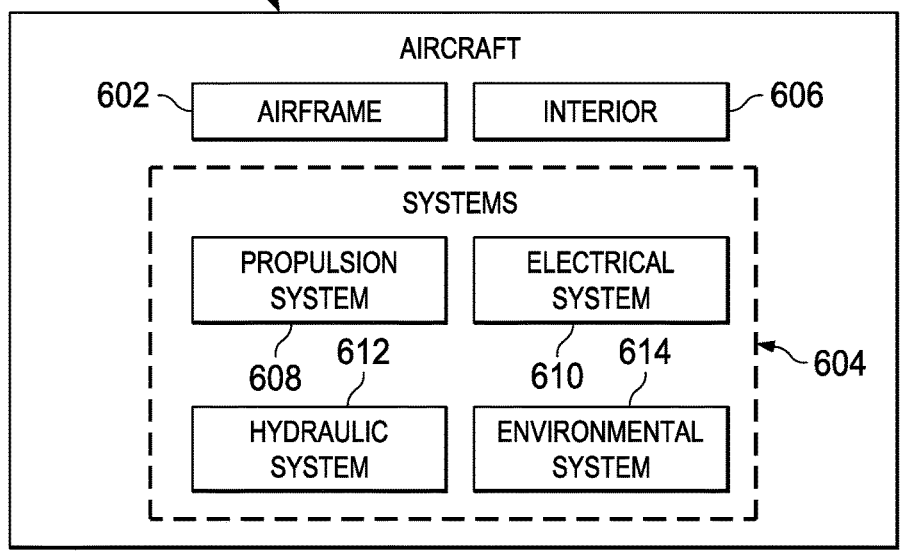
FIG. 6 is an illustration of an aircraft in the form of a block diagram in accordance with an illustrative embodiment.

Illustrative embodiments of the disclosure may be described in the context of aircraft manufacturing and service method 500 as shown in FIG. 5 and aircraft 600 as shown in FIG. 6. Turning first to FIG. 5, an illustration of an aircraft manufacturing and service method in the form of a block diagram is depicted in accordance with an illustrative embodiment. During pre-production, aircraft manufacturing and service method 500 may include specification and design 502 of aircraft 600 in FIG. 6 and material procurement 504.

During production, component and subassembly manufacturing 506 and system integration 508 of aircraft 600 in FIG. 6 takes place. Thereafter, aircraft 600 in FIG. 6 may go through certification and delivery 510 in order to be placed in service 512. While in service 512 by a customer, aircraft 600 in FIG. 6 is scheduled for routine maintenance and service 514, which may include modification, reconfiguration, refurbishment, and other maintenance or service.

Each of the processes of aircraft manufacturing and service method 500 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 6, an illustration of an aircraft in the form of a block diagram is depicted in which an illustrative embodiment may be implemented. In this example, aircraft 600 is produced by aircraft manufacturing and service method 500 in FIG. 5 and may include airframe 602 with plurality of systems 604 and interior 606. Examples of systems 604 include one or more of propulsion system 608, electrical system 610, hydraulic system 612, and environmental system 614. Without limitation, propulsion system 608 and/or environmental system 614 may include components such as any of those described for FIGS. 1-4 above. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 500 in FIG. 5. For example, one or more covers, implemented in a manner similar to cover 100 described in FIG. 1, along with a sealant material, such as sealant material 112 in FIG. 1, may be used to cover a corresponding one or more fastener systems for aircraft 600 during component and subassembly manufacturing 506, system integration 508, certification and delivery 510, and/or routine maintenance and service 514.

Using these types of covers may provide the desired level of suppression of the potential for sparking in aircraft 600. Further, using these types of covers may reduce the amount of time needed for sealing and covering fastener systems for aircraft 600 as compared to the currently available caps pre-molded from elastomeric sealants.

In one illustrative example, components or subassemblies produced in component and subassembly manufacturing 506 in FIG. 5 may be fabricated or manufactured in a manner similar to components or subassemblies produced while aircraft 600 is in service 512 in FIG. 5. As yet another example, one or more apparatus embodiments, method embodiments, or a combination thereof may be utilized during production stages, such as component and subassembly manufacturing 506 and system integration 508 in FIG. 5. One or more apparatus embodiments, method embodiments, or a combination thereof may be utilized while aircraft 600 is in service 512 and/or during maintenance and service 514 in FIG. 5. The use of a number of the different illustrative embodiments may substantially expedite the assembly of and/or reduce the cost of aircraft 600.

Thus, an apparatus and method are described above including at least an apparatus that may include a cover configured to be placed over a fastener system at a surface of an object in which the fastener system may be installed, wherein the cover may include of a number of composite materials selected such that the cover may be configured to reduce an effect of an electrical discharge, which may occur around the fastener system, on an environment outside the cover. The effect of the electrical discharge on the environment outside the cover may include an undesired release of a number of materials into the environment outside the cover in response to the electrical discharge. The number of composite materials may include at least one of: a carbon fiber-reinforced plastic material, a fiber-reinforced polymer, a glass-reinforced plastic, an aramid fiber-reinforced material, a metallic material, a fiberglass material, a plastic material, a thermoplastic material, and a thermoset material. The cover may be further configured to dissipate static charge. The number of composite materials may be selected such that at least one electrical property of the cover has a value within a range selected such that the cover may be configured to dissipate the static charge. The at least one electrical property of the cover may include at least one of: an electrical resistance of the cover, an electrical conductivity of the cover, and an electrical resistivity of the cover.

The fastener system referenced above may be located in a hole in the object, and the cover may be configured to substantially prevent at least one of: fluid flowing through the hole from flowing into the environment outside the cover, and fluid in the environment outside the cover from flowing through the hole. The fastener system may include a number of components including at least one of: a fastener, a washer, a plate, a spacer, a gasket, a buckle, and a locking device, and the fastener may be selected from one of a screw, a nut, a bolt, a nail, a rod, a dowel, a pin, a clamp, a grommet, a latch, a peg, a clip, a rod, a zipper, an anchor, a tie, and a tag.

A sealant material may be configured for use in attaching the cover to the surface of the object. The sealant material may be configured to be applied over the fastener system at the surface of the object prior to the cover being placed over the fastener system. The sealant material may be configured to be applied inside the cover prior to the cover being placed over the fastener system. The cover may include a flange configured to be attached to the surface of the object by the sealant material.

Further, a coating may be configured to be applied to at least a portion of the cover, wherein the coating is configured to at least one of: dissipate static charge, and reduce a level of corrosion at the surface of the object. The object may be a fuel tank in an aerospace vehicle. The surface of the fuel tank may be an inner surface. The cover may be configured to reduce a possibility of undesired effects occurring within the fuel tank in response to the electrical discharge occurring around the fastener system.

A method described above may be for covering a fastener system, the method may include: placing a cover over the fastener system at a surface of an object in which the fastener system may be installed, wherein the cover may be comprised of a number of composite materials; and reducing an effect of an electrical discharge, occurring around the fastener system, on an environment outside the cover, using the cover. For the method above, the step of reducing the effect of the electrical discharge, which occurs around the fastener system, on the environment outside the cover using the cover may include reducing an undesired release of a number of materials into the environment outside the cover in response to the electrical discharge occurring around the fastener system.

A method described above may include dissipating static charge using the cover, wherein the number of composite materials may include at least one of: a carbon fiber-reinforced plastic material, a fiber-reinforced polymer, a glass-reinforced plastic, an aramid fiber-reinforced material, a metallic material, a fiberglass material, a plastic material, a thermoplastic material, and a thermoset material. Additionally, the method may include preventing fluid flowing through a hole in the object in which the fastener system is installed from flowing into the environment outside the cover by using the cover.

A method described above may include applying a sealant material over the fastener system at the surface of the object prior to placing the cover over the fastener system.

Alternatively, or in conjunction, the method may include applying a sealant material inside the cover prior to placing the cover over the fastener system.

During production of an aircraft, such as without limitation aircraft 600 as shown in FIG. 6, component and subassembly manufacturing 506 and system integration 508 of aircraft 600 in FIG. 6 takes place. Components, such as any of those described for FIGS. 1-4 above and/or FIG. 7A through FIG. 8 below, may be manufactured or sub-assembled during production for aircraft 600 in FIG. 6. Thereafter, aircraft 600 in FIG. 6 may go through certification and delivery 510 in order to be placed in service 512. While in service 512 by a customer, aircraft 600 in FIG. 6 is scheduled for routine maintenance and service 514, which may include modification, reconfiguration, refurbishment, and other maintenance or service. Thus, maintenance and service may include modification, reconfiguration, refurbishment, and other maintenance or service to components such as any of those described for FIGS. 1-4 above and/or 7A-8 below.

Each of the processes of aircraft manufacturing and service method 500 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

As a non-limiting example, aircraft 600 may be produced by aircraft manufacturing and service method 500 in FIG. 5, and may include airframe 602 with plurality of systems 604 and interior 606. Airframe 602 may include components such as any of those described for FIGS. 1-4 above and/or 7A-8 below. Examples of systems 604 include one or more of propulsion system 608, electrical system 610, hydraulic system 612, and environmental system 614. Without limitation, propulsion system 608 and/or environmental system 614 may include components such as any of those described for FIGS. 1-4 above and/or 7A-8 below. Any number of other systems may be included. Although an aerospace example is shown, different illustrative embodiments may be applied to other industries, such as without limitation the automotive industry.

The illustrative embodiments presented recognize and take into account that fastener systems may be exposed to voltages and currents induced by an electromagnetic event, such as lightning, or some other type of electromagnetic event. It may be desirable to control an electrical current or discharge that may be caused by an electromagnetic event. As an example, it may be desirable to inhibit an electrical current or discharge that may be caused by an electromagnetic event from reaching or passing through some components of an aircraft.

More specifically, cover 100 (as shown in FIG. 2) may be formed from a pre-impregnated composite fiber. The pre-impregnated composite fiber material may be adept for molding processes of shapes with high contours. The pre-impregnated composite fiber material may be adept for molding processes with repeatable quality requirements. The pre-impregnated composite fiber material may integrate properties from various material components that improve performance of the cover beyond performance that may be provided by a single material. Without limitation, in some embodiments, cover 100 may comprise as much as 55% carbon fiber by volume.

Alternatively, cover 100 may be formed by injection molding. Whether made via injection molding or via pre-impregnated composite fiber plies, cover 100 may be fully cured to form a unitary, monolithic structure. Cover 100 may be fully cured before being placed over fastener system 102, and/or before sealant material 112 may be placed inside cover 100.

Cover 100 (as shown at least in FIGS. 1-2 and 7A-8) may be formed from materials configured such that cover 100 may be electrostatically benign. Cover 100 may be formed from materials configured such that cover 100 may perform as a high strength lightweight material that may suppress sparking.

Pre-impregnated composite fiber material forming cover 100 may be tailored to maximize strength. Hence, cover 100 may be a cured composite, and not formed from a cured sealant, such as without limitation a polysulfide. Material comprising cover 100 may be selected to minimize a weight of cover 100. As a non-limiting example, forming cover 100 using a fiber reinforced engineered structural composite molding compound may provide equal or better strength at one-half to one sixth the weight of a similar size and shaped cover 100 formed using a polysulfide component instead of the fiber reinforced engineered structural composite molding compound. Without limitation, a weight of cover 100 may be less than 2 grams.

Further, cover 100 may be formed from materials configured such that cover 100 may be tailored to inhibit galvanic corrosion by cover 100 of metal that may be electronically connected to cover 100, such as without limitation via an electrolyte. Thus, without limitation, when fastener system 102 and/or object 103 may contain an anodic material, such as without limitation an aluminum alloy, cover 100 may be formed such that carbon filaments within cover 100 may located in cover 100 so as not to be located in a position that may result in galvanic corrosion to metal that may be near cover 100.

In other words, without limitation, a carbon fiber within cover 100 may not be exposed to electrical contact with a metal nearby the cover, such as without limitation, fastener system 102 and/or object 103. Cover 100 may be coated with a coating that may isolate a carbon fiber in cover 100 in a form that precludes the carbon fiber from contributing to galvanic corrosion.

Alternatively and/or additionally, without limitation, cover 100 may include fiberglass reinforced epoxy. Without limitation, fiberglass reinforcement of the epoxy may be as much as 63 percent by volume of cover 100.

Cover 100 may be a monolithic domed shape configured to encircle exposed portion 204 of fastener system 102 that may extend above surface 101 of object 103. Cover 100 may encircle exposed portion 204, without contacting fastener system 102 or object 103, in a manner that prevents a material within cover 100, and/or an electrical discharge, from and/or between a component of fastener system 102, from reaching environment 114

The illustrative embodiments may recognize and take into account properties and limitations associated with using sealants to cover an exposed portion (such as, without limitation, exposed portion 204 at least as shown in FIGS. 2 and 7A-8) of a fastener system (such as, without limitation, fastener system 102 at least as shown in FIGS. 1-2 and 7A-8) beyond a surface (such as, without limitation, 101 as shown at least in FIGS. 1-2 and 7A-8) of an object (such as, without limitation, 103 at least as shown in FIGS. 1-2 and 7A-8). At the reduced temperatures sometimes present adjacent to exposed portion 204 of fastener system 102, brittleness of a sealant may increase. Increasing brittleness of a sealant may reduce its effectiveness as a barrier to release of material, heat, and or electrical current, caused by energy emitted from fastener system 102, into environment 114 bounded by object 103. Energy emitted from fastener system 102 may be of sufficient magnitude to cause some part of a sealant to separate from other parts of the sealant and be released or projected toward environment 114. A toughness and/or a cohesiveness of a sealant may be enhanced against separation caused by an energy release from fastener system 102. Increasing certain properties of the sealant, such as without limitation, which may include without limitation increasing a thickness of sealant material 112 around exposed portion 204 of fastener system 102, may result in an energy release from fastener system 102 not discharging energy or particles into environment 114.

As mentioned above, in some illustrative examples, sealant material 112 may be applied to first structure 104 without coming into contact with fastener system 102. For example, sealant material 112 may be applied in the shape of a ring (not shown), around fastener system 102, on surface 101 (as shown at least in FIGS. 1-2 and 7A-8). In some illustrative examples, sealant material 112 may be applied in a manner such that flange 201 of cover 100 may still contact sealant material 112 when cover 100 is placed over sealant material 112 and fastener system 102. Ring of sealant material 112 may be placed around fastener system 102 either manually, or by a machine. In some illustrative examples, sealant material 112 may be used solely for attaching cover 100 to first structure 104 and sealing an interface between cover 100 and first structure 104. Thus, sealant material 112 and cover 100 may form a non-porous barrier on first structure 104 around fastener system 102.

However, eliminating air from the spaces between fastener system 102 and environment 114 may limit energy that may be discharged from fastener system 102 from reaching environment 114, when space between fastener system 102 and environment 114 is occupied by sealant material 112. Thus, minimizing a presence of air, and/or an air pocket, and/or ignitable substances between fastener system 102 and environment 114, and replacing them with sealant material 112. Further, limiting energy that may be discharged from fastener system 102 may include sealant material 112 being made with components that give sealant material 112 dielectric properties. Hence, sealant material 112 may act as a dielectric. Sealant material 112 may reduce and/or eliminate a chance for an energy discharge from fastener system 102 from igniting any contents within cover 100 and/or in environment 114. In this context, without limitation, oxygen may be considered an ignitable substance.

Figure 7B:
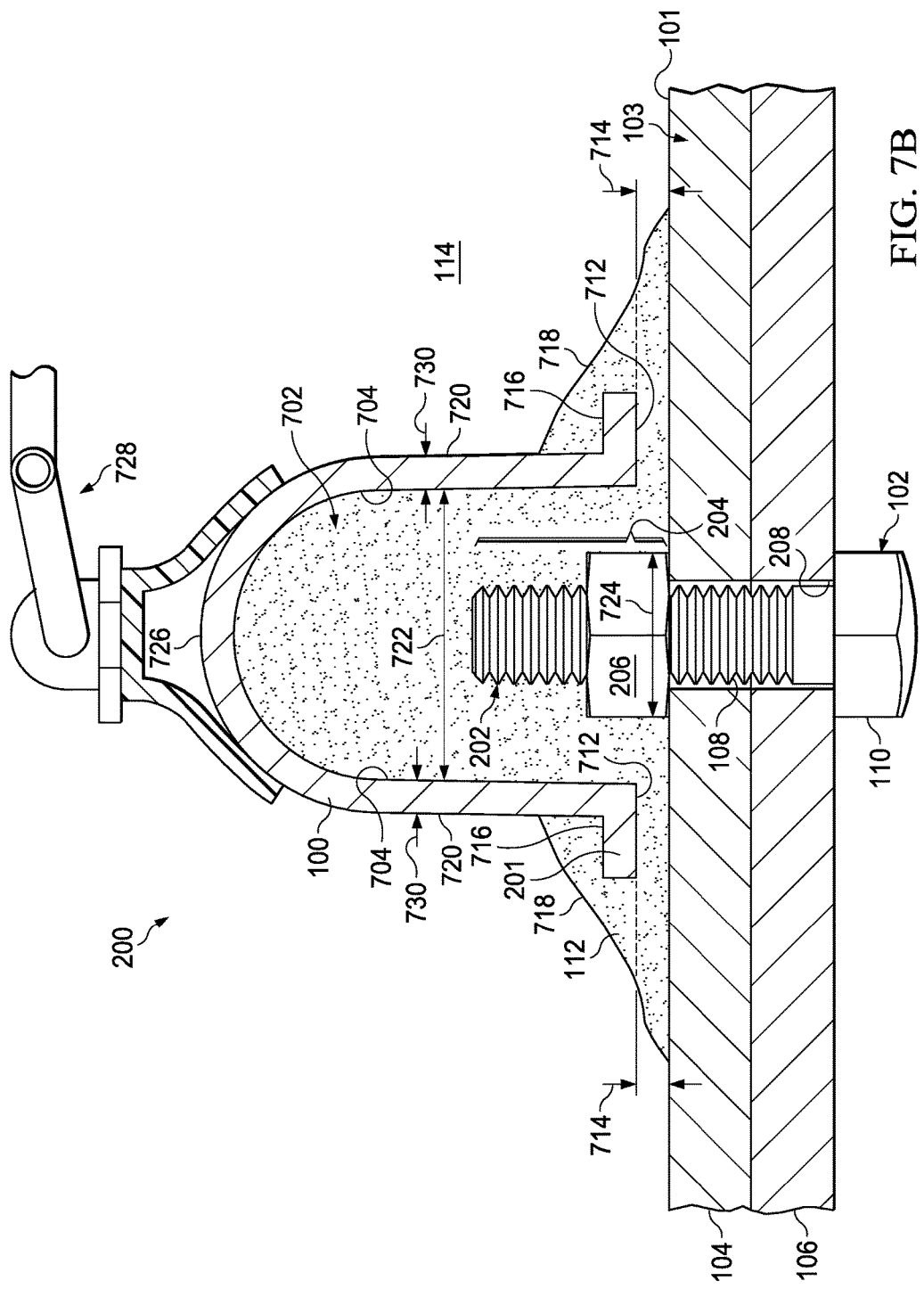

Thus, by filling cover 100 with sealant material 112, to a level inside cover 100 that results in displacement and dispersion of some sealant material 112 from inside cover 100, when cover 100 containing sealant material 112 may be placed over fastener system 102, out of cover 100 and up around flange 201 (as shown in FIG. 2 and FIGS. 7A and 7B) a barrier may be formed by cover 100 and sealant material 112 that isolates environment 114 from: energy discharges off fastener system 102, and any debris that might be generated thereby. Hence, the barrier that may be formed by cover 100 and sealant material 112, such that air, and/or an air pocket, and/or materials that may facilitate ignition and/or transmission of energy released from fastener system 102 to environment 114 and/or an ignitable substance therein are displaced from inside cover 100, around fastener system 102 and hole 208, combined with the dielectric properties of cover 100 and sealant material 112 may suppress an effect of an electrical discharge, occurring around fastener system 102, on environment 114 outside cover 100. Likewise, the barrier, that may be formed by cover 100 and sealant material 112, around fastener system 102 and hole 208, combined with a non-porous property of cover 100 and sealant material 112 may prevent a fluid from passing between surface 101 side of object 103 to the side of object 103 shown in FIG. 2 as contacting head of bolt 110, such as might occur, without limitation through hole 208, if the barrier, that may be formed by cover 100 and sealant material 112, around fastener system 102 and hole 208 were not present.

Referring now to FIGS. 7A and 7B, FIGS. 7A and 7B are illustrations of a cross-sectional views of a cover installed over a fastener system in accordance with an illustrative embodiment; FIG. 7A is an illustration of a cross-sectional view of a cover connected to a machine in accordance with an illustrative embodiment; FIG. 7B is an illustration of a cross-sectional view of a cover being installed over a fastener system by the machine, in accordance with an illustrative embodiment. More specifically, FIGS. 7A and 7B retain all the item numbers for features shown in FIG. 2, and additionally depict volume 702, inner wall 704, level 706, level 708, level 710, edge 712, sealant layer 714 (shown in FIG. 7B), edge 716 (shown in FIG. 7B), fairing 718 (shown in FIG. 7B), exterior side 720, interior diameter 722 (shown in FIG. 7B), exterior dimension 724 (shown in FIG. 7B), dome 726, and machine 728. Still further, FIG. 7A shows a cross sectional view of cover 100 retaining sealant material 112, before being placed over fastening system 102, and as cover 100 is placed over fastening system 102 in object 103.

Accordingly, dome 726 of cover 100 may be shaped and configured with a form an interior surface that may displace the sealant material 112, as a result of cover 100 being placed over fastener system 102, in a manner such that air, and/or an air pocket, and/or materials that may facilitate ignition and/or transmission of energy released from fastener system 102 to environment 114 and/or an ignitable substance therein, do not occupy volume 702 inside of cover 100. Volume 702 may include the entire volume between inner wall 704 and under dome 726 of cover 100. In other words, volume 702 may be fully occupied by sealant material 112 after cover 100 is in place over fastener system 102.

As shown in FIG. 7A, a fill level, for sealant material 112 inside cover 100, before cover may be placed over fastener system 102, may be computed based upon a dimension and volume, of extended portion 204 that extends above surface 101, of fastener system 102 such that when cover 100 may be placed over fastener system 102, sealant material 112 may be forced out of cover 100 by fastener system 102. Dependent upon the dimension and volume, of extended portion 204 that extends above surface 101, of fastener system 102, the amount of sealant material 112 that may be present in cover 100, before cover 100 may come in contact with fastener system 102, may be at a level below edge 712 of flange 201 of cover 100, such as without limitation, level 706. Dependent upon the dimension and volume, of extended portion 204 that extends above surface 101, of fastener system 102, the amount of sealant material 112 that may be present in cover 100, before cover 100 may come in contact with fastener system 102, may be at a level even with edge 712 of flange 201 of cover 100, such as without limitation, level 708. Dependent upon the dimension and volume, of extended portion 204 that extends above surface 101, of fastener system 102, the amount of sealant material 112 that may be present in cover 100, before cover 100 may come in contact with fastener system 102, may be at a level above edge 712 of flange 201 of cover 100, such as without limitation, level 710.

In one illustrative embodiment, a fill level selected for sealant material 112 inside cover 100 may be selected such that as cover 100 is placed over fastener system 102, fastener system 102 acting on sealant material 112 may force sealant material 112 out of cover 100, to form sealant layer 714, between flange 201 of cover 100 and a surface that fastener system 102 extends from, such as without limitation, surface 101 of object 103 as shown in FIG. 7B. Fastener system 102 may act on sealant material 112 to displace sealant material 112 inside volume 702 into dome 726 where shape of dome 726 may transfer displacement of sealant material 112 along inner wall 704 between inner wall 704 and extended portion 204 and out under flange 201 edge 712. Sealant layer 714 may have a depth that may be varied based upon a type of fastener used and requirements for a lightning strike test for the type of fastener, and/or a location for the fastener, and/or equipment adjoining the location.

A particular fill level selected for sealant material 112 may be selected such that a sufficient amount of sealant material 112 is forced out of cover 100 as a squeeze out to coat edge 716 of flange 201 and form fairing 718. Fairing 718 may adhere to exterior side 720 of cover 100 and to surface 101 of object 103. Fairing 718 may be smoothly sloped between exterior side 720 of cover 100, and surface 101. Fairing 718 may be formed with sealant material 112 squeezed out or extruded between flange 201 of cover 100 and surface 101 by an automated fairing tool (not shown) or by a manual process.

Accordingly, an interior diameter 722 of cover 100 may be greater than an exterior dimension 724 across a widest portion of fastener system 102 above surface 101, such as without limitation, exterior dimension 724 across a widest portion of fastener system 102, such at least without limitation a width of nut 206 as shown in FIG. 7B. Cover 100 not being in direct contact with the widest portion of fastener system 102, such as without limitation the width of nut 206 in FIG. 7B, allows dome 726 of monolithic cover 100 to transfer a force from fastener system 102 on sealant material 112 inside cover 100 to sealant material 112 and displace sealant material 112 to move away from dome 726 and past fastener system 102, along inner wall 704 to extrude between flange 201 of cover 100 and surface 101 of object 103, such that fairing 718 may be formed from sealant material 112 that may contact, surround and adhere to flange 201.

Nut 206 may include a head or collar of the nut that differ or expand in a manner different from nut 206 as shown in the figures. Further, in some embodiments (not shown) fastener system 102 as shown in the figures, may be inverted (not shown), such that extended portion 204 may be a head of the fastener system that is enveloped by cover 100 and sealant material 112. In such an embodiment, nut 206 may be located on the opposite side of object 103, such that nut 206 is not the portion of fastener system 102 that may be enveloped by cover 100 and sealant material 112.

In other words, cover 100 does not directly contact any element of fastener system 102 and does not form a slip fit around any element of fastener system 102. Cover 100 may thereby form a contactless connection to fastener system 102 and/or to object 103 retaining fastener system 102, such that a contactless connection is a connection between items without the items directly contacting each other. The contactless connection may be via adherence of sealant material 112 to cover 100 and to fastener system 102.

Thus, when cover 100 is placed over fastener system 102, cover 100 may be rotated about fastener system 102. Rotating cover 100 about fastener system 102 as sealant material 112 extrudes between flange 201 and surface 101 may enhance prevention of any air pockets in sealant material 112 between flange 201 and surface 101. Rotating cover 100 about fastener system 102 as sealant material 112 extrudes between flange 201 and surface 101 may enhance bonding between cover 100 and surface 101. Placement and/or rotation of cover 100 over fastener system 102 may be done manually, or by a machine such as machine 728 shown in FIGS. 7A and 7B. However, once sealant material 112 cures, cover 100 remains fixed in place over fastener system 102.

It is possible that extrusion of sealant material 112 from under flange 201 will not form fairing 718, but rather form a beaded collection of sealant material 112, that may form an annular bead around flange 201. Because a beaded shape may be more susceptible to erosion and/or decomposition when located in an area of moving fluids, before sealant material 112 cures, amounts of sealant material 112 that may extrude out between flange 201 and surface 101 into environment 114 may be manually or mechanically formed to fairing 718 shaped similar to the shape of fairing 718 shown in FIG. 7B.

Further, forming fairing 718 of sealant material 112 that may extrude out between flange 201 and surface 101 into environment 114 may eliminate any air pocket that may form within bead of sealant material 112 during extrusion. The different illustrative embodiments recognize and take into account that it is undesirable for an electrical discharge to reach a pocket of air, because the air may ignite into an explosion. The explosion or heat generated thereby may cause damage to a sealant and/or cover for a design that lacks the strength and suppressive characteristics of the different illustrative embodiments as described. Such damage may result in contaminants being deposited into an environment outside such a design.

Sealant material 112 may be formed from components that may fully cure within 24 hours of being placed into cover 100 at a temperature between 70-80 degrees Fahrenheit at 45-55% humidity. Cure time may be accelerated if a temperature of an object being sealed or the air around the sealant material is warmed.

Thus, by shaping sealant material 112 that may be directly exposed to moving fluids into a smoothly sloped shape that adheres to an outside of cover 100, such that flange 201 is fully covered by sealant material 112, and to surface 101, from which fastener system 102 extends, the durability of the sealant material 112, isolating fastener system 102 and/or hole 208 from elements present in environment 114 may be enhanced as compared to allowing sealant material 112, that extrudes between flange 201 and surface 101 from forming extruded to form an annular bead around flange 201.

In other words, forming fairing 718 shaped as presented in FIG. 7B, lowers a risk of an erosion of sealant material 112 that may create debris in a fluid, held within a tank formed by object 103. Accordingly, an amount of sealant material 112 that may be loaded into cover 100 before cover 100 engages fastener system 102 may be selected to ensure a sufficient amount of sealant material 112 will be extruded between flange 201 and surface 101 to allow formation of fairing 718 as shown in FIG. 7B. Further, sealant material 112 may be non-porous so that sealant material 112 may serve to prevent a fluid that may be present in environment 114 from entering hole 208, or a fluid that may be present on a side of second structure 106 that retains a head of bolt 110.

Additionally, although the description above of selection of amount and level of sealant material 112 to place in cover 100 is presented relative to a single exposed portion 204 of a single bolt 110, the description above may be applied to covering more than one exposed portion at a time with a single cover 100. In other words, a size for cover 100 and an amount of sealant material 112 placed in cover 100 to a selected fill line may be determined that may envelop and seal more than one exposed portion 204 of more than one (not shown) bolt 110 by the placement of a single cover 100. Hence, references to fastener system 102 may include one or more exposed portion 204 for more than one fastener system 102 simultaneously, such that each exposed portion 204 may be without limitation for a bolt 110, or any other type fastener and/or protrusion that may extend from surface 101.

The current embodiments recognize and take into consideration, that if a fastener, without a sealant coating and/or cover of some construction over the fastener, emits an electrical discharge of sufficient energy, then the fastener may produce a discharge or fracturing of materials that may project out into an environment around the fastener. Thus, without limitation if the environment around the fastener is the interior of a tank, fluid within the tank may become contaminated by the discharge.

Thus, cover 100 may be constructed with electrical and structural properties that may withstand an electrical discharge from fastener system 102 without cover 100 being damaged in a manner that would allow debris to enter into environment 114. Accordingly, without limitation, cover 100 may include a composite construction that may have width 730 of at least 0.125 inches. Cover 100 and sealant material 112 may form a system that meets critical design configuration control limitations and/or other requirements of United States Federal Aviation Regulation 14 CFR 25.954 Fuel system lightning protection and/or 14 CFR 25.981 Fuel tank ignition prevention, and/or the requirements of proposed United States Federal Aviation Administration Advisory Circular 25.954-X related to the notice of proposed rulemaking presented in the Federal Register/Vol. 79, No. 243/Thursday, Dec. 18, 2014/75496.

Figure 8:
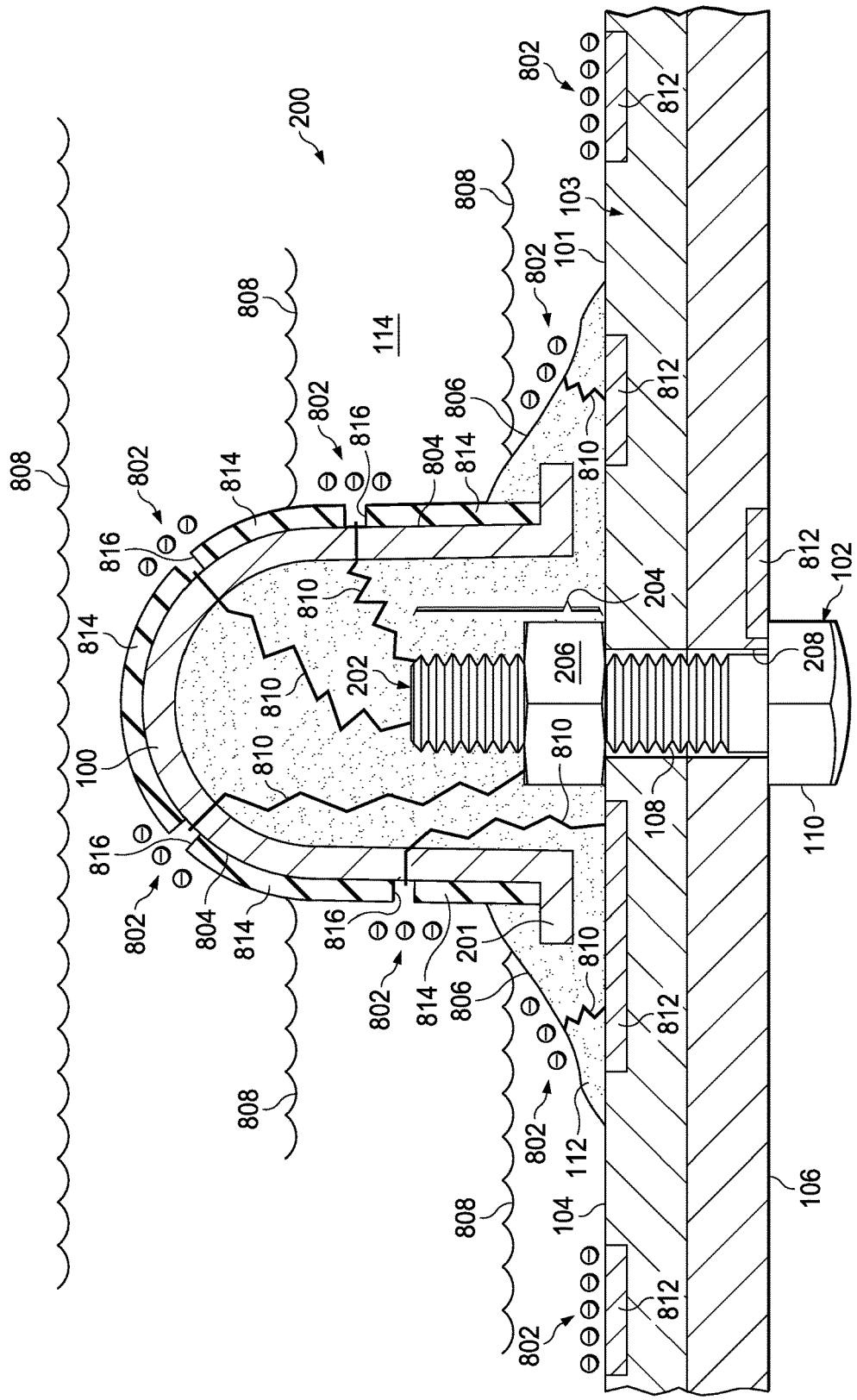
FIG. 8 is an illustration of a cross-sectional view of a cover installed over a fastener system in accordance with an illustrative embodiment.

With reference now to FIG. 8, a cross-sectional view depicts a cover installed over a fastener system in an object retaining a fluid with a static electric charge, in accordance with an illustrative embodiment. FIG. 8 retains all the item numbers for features shown in FIG. 2, and additionally depicts static charge 802, exterior side 804, fairing 806, fluid 808, path 810, grounding strip 812, coating 814, and micropore 816. As shown in FIG. 8, object 103 may represent a tank that may retain fluid 808. FIG. 8 illustrates that in addition to being configured of materials formed to function as a dielectric that may isolate an electrical discharge from or among components of fastener system 102, or a detrimental affect therefrom, from reaching environment 114, cover 100 and/or sealant material 112 may also include materials configured to dissipate a static charge that may accumulate upon a surface of cover 100.

Static charge 802 may accumulate at any location upon exterior side 804 of cover 100 or fairing 806 formed by sealant material 112. Exterior side 804 may be an example of exterior side 720 of cover 100 as shown in FIG. 7B, in accordance with an illustrative embodiment. Fairing 806 may be an example of fairing 718 of FIG. 7B, in accordance with an illustrative embodiment.

When object 103 may form a tank, fluid 808 may be retained within the tank formed by object 103. Static charge 802 may be generated by fluid 808 present inside the tank. The different illustrative embodiments recognize and take into account that when fluid 808 within object 103 may have a potential to ignite, such as without limitation when fluid 808 may be fuel for an aircraft, that static charge 802 may present an undesired ignition source that should be minimized and/or eliminated.

Thus, cover 100 and/or sealant material 112 may be formed of materials configured to provide a path, such as without limitation path 810, for low current movement of static charge 802 off of exterior side 804 and/or fairing 806 to an item that may provide electrical grounding. Without limitation fastener system 102, and/or object 103, and/or grounding strip 812 may be configured to provide electrical grounding for static charge 802.

Cover 100 may have coating 814. Coating 814 in FIG. 8 is not shown to scale. Coating 814 in FIG. 8 is shown enlarged to help visualize static charge 802 pathway through coating 814 via micro-pore 816. Coating 814 may be a microporous coating that may contain a number of micropore 816 that may allow static charge 802 to move from exterior side 804 through cover 100 and into sealant material 112.

Sealant material 112 may include components configured such that sealant material 112 may serve as an electrical pathway from cover 100 to an electrical grounding material, such as without limitation, fastener system 102, and/or object 103, and/or grounding strip 812. Although only five locations are shown for grounding strip 812, such strips may be located at various positions within and/or connecting to first structure 104, second structure 106, and/or fastener system 102, and/or as a single continuous grounding system.

Hence, in contrast to a cover that acts as a Faraday shield or cage that diverts a current headed toward an object to pass around that object, cover 100 may be configured of material forming a pre-impregnated composite that may act both as a dielectric that retains the effects of a high voltage electrical discharge from or among components of fastener system 102, as well as a static dissipative low current pathway that removes static charge 802 from exterior side 804 and/or fairing 806 of sealant material 112. Similarly, sealant material 112 may also provide a static dissipative low current pathway, such as without limitation path 810, for static charge 802 to move through fairing 806 to an electrical grounding material, such as without limitation fastener system 102, and/or object 103, and/or grounding strip 812. Without limitation sealant material 112 and/or cover 100 may be configured to possess a surface resistivity in a range of $10^6$-$10^9$ ohms/sq range.

Thus, it can be recognized that a "cap" combined with a sealant may be used to prevent substances such as, for example, without limitation, air, liquid, dirt, and/or other types of substances from crossing the barrier formed by the cap and the sealant. The cap may be fully occupied with the sealant that may adhere to the cap, a fastener system covered by the cap, and an object that retains the fastener system. The cap may be without limitation cover 100 as shown in figures above. Sealant may be sealant material 112 shown in figures above.

Thus, an effect of an electrical discharge, occurring around the fastener system, on an environment outside the cap may be reduced by using the sealant and the cap. The combination of cap and sealant may provide protection to the environment around the cap from an electromagnetic event, such as without limitation, a lightning strike to an aircraft. Such protection may be particularly beneficial where the object is a fuel tank of an aircraft.

Figure 9:
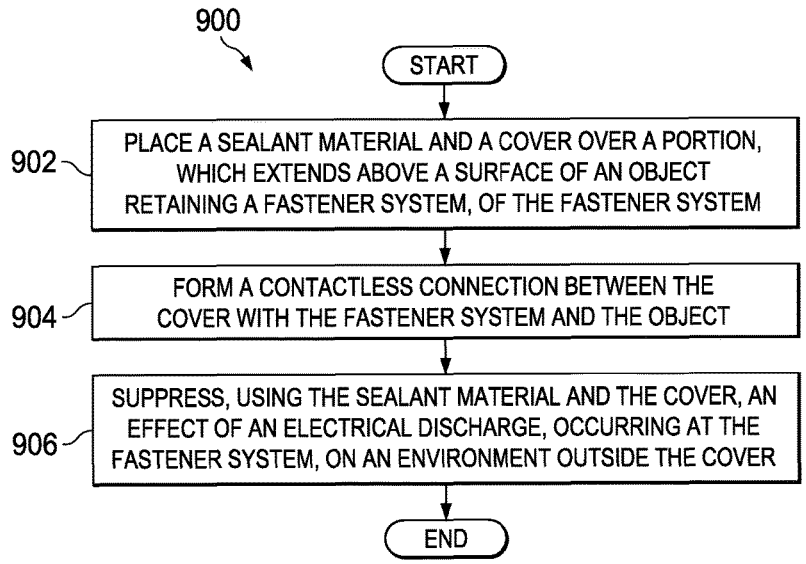
FIG. 9 is an illustration of a process for covering a fastener system in the form of a flowchart in accordance with an illustrative embodiment

Thus, embodiments described above that may perform as part of a process for covering a fastener system. With reference now to FIG. 9, FIG. 9 is an illustration of a process for covering a fastener system in the form of a flowchart in accordance with an illustrative embodiment. More specifically, FIG. 9 shows process 900 that may include placing a sealant material and a cover over a portion, which extends above a surface of an object retaining the fastener system, of the fastener system (Operation 902). The cover may be a monolithic domed form made from a number of composite materials.

Process 900 may include forming a contactless connection between the cover with the fastener system and the object. (Operation 904). Process 900 may include suppressing, using the sealant material and the cover, an effect of an electrical discharge, occurring around the fastener system, on an environment outside the cover. (Operation 906).

Process 900 may also include applying a sealant material over the fastener system at the surface of the object prior to placing the cover over the fastener system, and/or applying a sealant material inside the cover prior to placing the cover over the fastener system.

Figure 10:
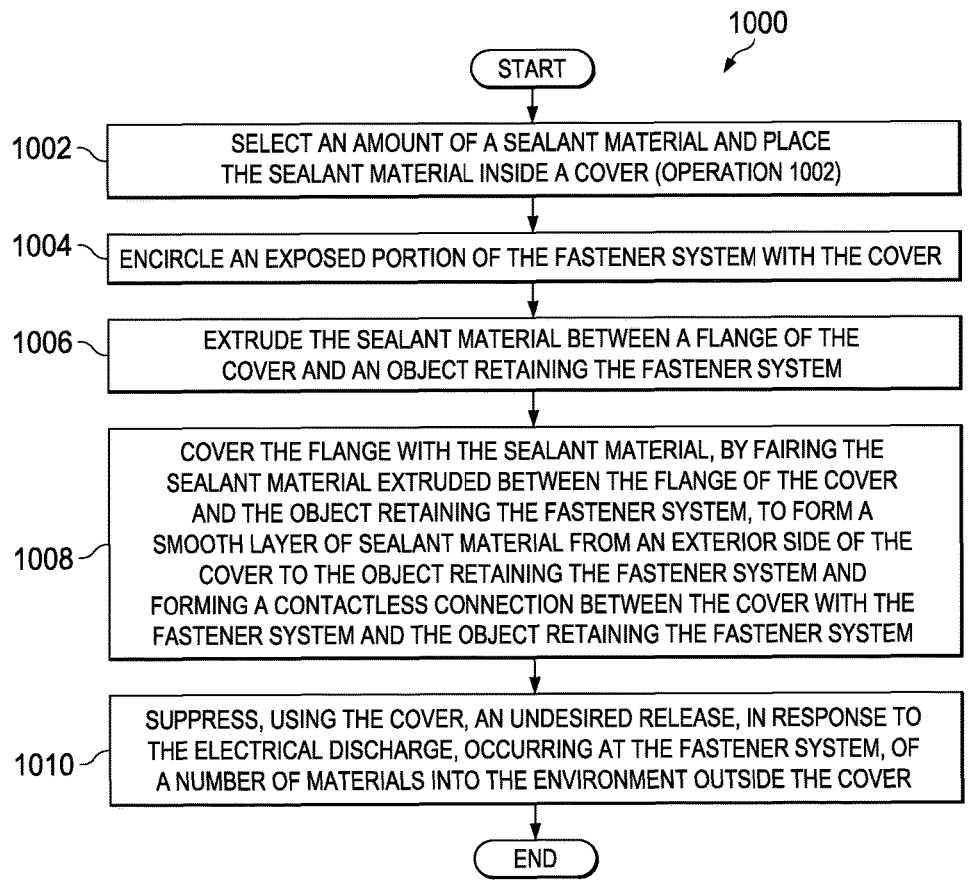
FIG. 10 is an illustration of a process for reducing an effect of an electrical discharge, occurring at a fastener system, on an environment, in accordance with an illustrative embodiment.

Likewise, an apparatus and a system may be described above that may perform as part of a process for reducing an effect of an electrical discharge, occurring at a fastener system, on an environment. With reference now to FIG. 10, FIG. 10 is an illustration of a process for reducing an effect of an electrical discharge, occurring at a fastener system, on an environment, in accordance with an illustrative embodiment. More specifically, FIG. 10 shows process 1000 that may include selecting an amount of a sealant material and placing the sealant material inside a cover (Operation 1002). The cover may be a monolithic domed shaped composite.

Process 1000 may include encircling an exposed portion of the fastener system with the cover (Operation 1004). The cover may be a pre-impregnated composite comprising a number of composite materials comprising at least one of: a carbon fiber-reinforced plastic material, a fiber-reinforced polymer, a glass-reinforced plastic, an aramid fiber-reinforced material, a metallic material, a fiberglass material, a plastic material, a thermoplastic material, and a thermoset material. The cover may also be configured with an electrical resistivity comprising a volume resistivity of about $1.0 \times 10^9$ ohm-meters (Ω-m) or less when measured at about 40 volts (V) and an electrical resistivity comprising a surface resistivity of about $1.0 \times 10^{11}$ ohm per square (Ω/sq) or less when measured at about 100 volts (V) or less.

Encircling an exposed portion of the fastener system with the cover may result in extruding the sealant material between a flange of the cover and an object retaining the fastener system (Operation 1006). This may be followed by covering the flange with the sealant material, by fairing the sealant material extruded between the flange of the cover and the object retaining the fastener system, to form a smooth layer of sealant material from an exterior side of the cover to the object retaining the fastener system and forming a contactless connection between the cover with the fastener system and the object retaining the fastener system (Operation 1008).

Process 1000 may include suppressing an undesired release, in response to the electrical discharge, occurring at the fastener system, of a number of materials into the environment outside the cover (Operation 1010).

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A process for covering a fastener system, the process comprising:

calculating a predetermined depth between a flange of a cover and a surface of an object;

placing a sealant material and the cover over a portion of the fastener system which extends above the surface of the object retaining the fastener system such that the cover comprises a monolithic domed form comprising a number of composite materials;

forming a contactless connection between the cover with the fastener system and the object so that the sealant material envelopes a radially extending flange of the cover and surrounds a portion of an outside surface of the cover, while maintaining a non-zero depth of the sealant material between a bottom of the flange and a surface of an object from which the fastener system extends; and suppressing, using the sealant material and the cover, an effect of an electrical discharge, occurring around the fastener system, on an environment outside the cover.

2. The process of claim 1, further comprising, applying the sealant material over the fastener system at the surface of the object prior to placing the cover over the fastener system.

3. The process of claim 1, further comprising, applying the sealant material inside the cover prior to placing the cover over the fastener system.

4. The process of claim 1, wherein calculating the predetermined depth between the flange of the cover and the surface of the object is based on the fastener system and a requirement for a lightning strike test for the fastener system.

5. The process of claim 1, wherein the cover is filled with sealant material to a fill level so that when the cover is placed over the fastener system, sealant material is forced out of the cover to form a sealant layer at the predetermined depth and to form a fairing.

6. A process for reducing an effect of an electrical discharge, occurring at a fastener system, on an environment, the process comprising:

calculating a predetermined depth between a flange of a cover and a surface of an object;

selecting an amount of a sealant material and placing the sealant material inside a cover, the cover being a monolithic domed shaped composite;

encircling an exposed portion of the fastener system with the cover;

extruding, by placing the cover encircling the fastening system, the sealant material between a radially extending flange of the cover and an object retaining the fastener system; and covering the radially extending flange with the sealant material, by fairing the sealant material extruded between the radially extending flange of the cover and the object retaining the fastener system, to form a fairing of sealant material from an exterior side of the cover to the object retaining the fastener system and forming a contactless connection between the cover with the fastener system and the object retaining the fastener system; and suppressing an undesired release, in response to the electrical discharge, occurring at the fastener system, of a number of materials into the environment outside the cover;

wherein when the cover is placed over the fastener system, sealant material is forced out of the cover to form a sealant layer at the predetermined depth and to form the fairing; and wherein the sealant material envelopes the radially extending flange of the cover and surrounds a portion of an outside surface of the cover, while maintaining a non-zero depth of the sealant material between a bottom of the flange and a surface of an object from which the fastener system extends.

7. The process of claim 6 further comprising, fabricating the cover as a pre-impregnated composite comprising a number of composite materials comprising at least one of: a carbon fiber-reinforced plastic material, a fiber-reinforced polymer, a glass-reinforced plastic, an aramid fiber-reinforced material, a metallic material, a fiberglass material, a plastic material, a thermoplastic material, and a thermoset material.

8. The process of claim 6 further comprising: fabricating the cover to comprise: an electrical resistivity comprising a volume resistivity of about $1.0 \times 10^9$ ohm-meters ($\Omega$-m) or less when measured at about 40 volts (V), and an electrical resistivity comprising a surface resistivity of about $1.0 \times 10^{11}$ ohm per square ($\Omega$/sq) or less when measured at about 100 volts (V) or less.

9. The process of claim 6, wherein calculating the predetermined depth between the flange of the cover and the surface of the object is based on the fastener system and a requirement for a lightning strike test for the fastener system.

10. A portion of an aircraft assembled according to a process for covering a fastener system, the process comprising:

calculating a predetermined depth between a flange of a cover and a surface of an object;

placing a sealant material and the cover over a portion of the fastener system which extends above the surface of the object retaining the fastener system such that the cover comprises a monolithic domed form comprising a number of composite materials;

forming a contactless connection between the cover with the fastener system and the object so that the sealant material envelopes a radially extending flange of the cover and surrounds a portion of an outside surface of the cover, while maintaining a non-zero depth of the sealant material between a bottom of the flange and a surface of an object from which the fastener system extends; and suppressing, using the sealant material and the cover, an effect of an electrical discharge, occurring around the fastener system, on an environment outside the cover.

11. The portion of the aircraft assembled according to the process for covering the fastener system of claim 10, wherein the process further comprises:

applying the sealant material over the fastener system at the surface of the object prior to placing the cover over the fastener system.

12. The portion of the aircraft assembled according to the process for covering the fastener system of claim 10, wherein the process further comprises:

applying the sealant material inside the cover prior to placing the cover over the fastener system.

13. The portion of the aircraft assembled according to the process for covering the fastener system of claim 10, wherein calculating the predetermined depth between the flange of the cover and the surface of the object is based on the fastener system and a requirement for a lightning strike test for the fastener system.

14. The portion of the aircraft assembled according to the process for covering the fastener system of claim 10, wherein the cover is filled with sealant material to a fill level so that when the cover is placed over the fastener system, sealant material is forced out of the cover to form a sealant layer at the predetermined depth and to form a fairing.

15. A portion of a fuel tank assembled according to a process for reducing an effect of an electrical discharge, occurring at a fastener system, on an environment, the process comprising:
calculating a predetermined depth between a flange of a cover and a surface of an object;
selecting an amount of a sealant material and placing the sealant material inside a cover, the cover being a monolithic domed shaped composite;
encircling an exposed portion of the fastener system with the cover;
extruding, by placing the cover encircling the fastening system, the sealant material between a radially extending flange of the cover and an object retaining the fastener system; and
covering the radially extending flange with the sealant material, by fairing the sealant material extruded between the radially extending flange of the cover and the object retaining the fastener system, to form a fairing of sealant material from an exterior side of the cover to the object retaining the fastener system and forming a contactless connection between the cover with the fastener system and the object retaining the fastener system; and
suppressing an undesired release, in response to the electrical discharge, occurring at the fastener system, of a number of materials into the environment outside the cover;
wherein when the cover is placed over the fastener system, sealant material is forced out of the cover to form a sealant layer at the predetermined depth and to form the fairing; and
wherein the sealant material envelopes the radially extending flange of the cover and surrounds a portion of an outside surface of the cover, while maintaining a non-zero depth of the sealant material between a bottom of the flange and a surface of an object from which the fastener system extends.

16. The portion of the fuel tank assembled according to the process of claim 15, the process further comprising, fabricating the cover as a pre-impregnated composite comprising a number of composite materials comprising at least one of: a carbon fiber-reinforced plastic material, a fiber-reinforced polymer, a glass-reinforced plastic, an aramid fiber-reinforced material, a metallic material, a fiberglass material, a plastic material, a thermoplastic material, and a thermoset material.

17. The portion of the fuel tank assembled according to the process of claim 15, the process further comprising: fabricating the cover having an electrical resistivity comprising a volume resistivity of about $1.0 \times 10^9$ ohm-meters ($\Omega$-m) or less when measured at about 40 volts (V), and an electrical resistivity comprising a surface resistivity of about $1.0 \times 10^{11}$ ohm per square ($\Omega$/sq) or less when measured at about 100 volts (V) or less.

18. The portion of the fuel tank assembled according to the process of claim 15, wherein calculating the predetermined depth between the flange of the cover and the surface of the object is based on the fastener system and a requirement for a lightning strike test for the fastener system.

* * * * *

UNITED STATES PATENT AND TRADEMARK OFFICE
CERTIFICATE OF CORRECTION

PATENT NO. : 10,051,767 B2
APPLICATION NO. : 14/725994
DATED : August 14, 2018
INVENTOR(S) : Yoon et al.

Page 1 of 1

It is certified that error appears in the above-identified patent and that said Letters Patent is hereby corrected as shown below:

In the Claims

Column 20, Line 5, change "and a surface of an object" to --and the surface of the object--
Column 20, Line 42-43 change "and a surface of an object" to --and the surface of the object--
Column 22, Line 9, change "and a surface of an object" to --and the surface of the object--

Signed and Sealed this
Fourth Day of December, 2018

Andrei Iancu
*Director of the United States Patent and Trademark Office*